(12) United States Patent
Sapp et al.

(10) Patent No.: US 7,291,894 B2
(45) Date of Patent: Nov. 6, 2007

(54) VERTICAL CHARGE CONTROL SEMICONDUCTOR DEVICE WITH LOW OUTPUT CAPACITANCE

(75) Inventors: Steven Sapp, Felton, CA (US); Peter H. Wilson, Boulder Creek, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 24 days.

(21) Appl. No.: 10/931,887

(22) Filed: Aug. 31, 2004

(65) Prior Publication Data

US 2005/0023607 A1    Feb. 3, 2005

Related U.S. Application Data

(62) Division of application No. 10/200,056, filed on Jul. 18, 2002, now Pat. No. 6,803,626.

(51) Int. Cl.
*H01L 29/00*    (2006.01)
*H01L 29/76*    (2006.01)
*H01L 29/94*    (2006.01)
*H01L 31/062*   (2006.01)
*H01L 31/113*   (2006.01)

(52) U.S. Cl. ............ 257/506; 257/335; 257/341; 257/401; 257/499; 257/500; 257/501; 257/502; 257/503; 257/504; 257/505; 257/507; 257/508; 257/509; 257/510; 257/524

(58) Field of Classification Search ........... 257/374, 257/905, 329–331, 341–342, 489–490, 335, 257/401, 499–510, 524
See application file for complete search history.

(56) References Cited

U.S. PATENT DOCUMENTS

| 3,404,295 A | 10/1968 | Warner et al. |
| 3,412,297 A | 11/1968 | Amlinger |
| 3,497,777 A | 2/1970 | Teszner et al. |

(Continued)

FOREIGN PATENT DOCUMENTS

CN    1036666 A    10/1989

(Continued)

OTHER PUBLICATIONS

Bai et al., "Novel automated optimization of power MOSFET for 12V input, high-frequency DC-DC converter," *International Symposium on Power Semiconductors and ICs, Technical Digest*, (2003), pp. 366-369.

(Continued)

*Primary Examiner*—Ida M. Soward
(74) *Attorney, Agent, or Firm*—Townsend and Townsend and Crew LLP

(57) ABSTRACT

In accordance with an embodiment of the present invention, a MOSFET includes at least two insulation-filled trench regions laterally spaced in a first semiconductor region to form a drift region therebetween, and at least one resistive element located along an outer periphery of each of the two insulation-filled trench regions. A ratio of a width of each of the insulation-filled trench regions to a width of the drift region is adjusted so that an output capacitance of the MOSFET is minimized.

17 Claims, 10 Drawing Sheets

U.S. PATENT DOCUMENTS

| | | |
|---|---|---|
| 3,564,356 A | 2/1971 | Wilson |
| 3,660,697 A | 5/1972 | Berglund et al. |
| 4,003,072 A | 1/1977 | Matsushita et al. |
| 4,300,150 A | 11/1981 | Colak |
| 4,326,332 A | 4/1982 | Kenney et al. |
| 4,337,474 A | 6/1982 | Yukimoto |
| 4,345,265 A | 8/1982 | Blanchard |
| 4,445,202 A | 4/1984 | Geotze et al. |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,698,653 A | 10/1987 | Cardwell, Jr. |
| 4,716,126 A | 12/1987 | Cogan |
| 4,746,630 A | 5/1988 | Hui et al. |
| 4,754,310 A | 6/1988 | Coe |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,967,245 A | 10/1990 | Cogan et al. |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,142,640 A | 8/1992 | Iwanatsu |
| 5,164,325 A | 11/1992 | Cogan et al. |
| 5,164,802 A | 11/1992 | Jones et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,262,336 A | 11/1993 | Pike, Jr. et al. |
| 5,268,311 A | 12/1993 | Euen et al. |
| 5,275,965 A | 1/1994 | Manning |
| 5,294,824 A | 3/1994 | Okada |
| 5,298,781 A | 3/1994 | Cogan et al. |
| 5,300,447 A | 4/1994 | Anderson |
| 5,326,711 A | 7/1994 | Malhi |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,519,245 A | 5/1996 | Tokura et al. |
| 5,539,238 A * | 7/1996 | Malhi .................. 257/510 |
| 5,541,425 A | 7/1996 | Nishihara |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A * | 11/1996 | Hshieh et al. ............. 257/330 |
| 5,581,100 A | 12/1996 | Ajit |
| 5,583,065 A | 12/1996 | Miwa |
| 5,592,005 A | 1/1997 | Floyd et al. |
| 5,595,927 A | 1/1997 | Chen et al. |
| 5,597,765 A | 1/1997 | Yilmaz et al. |
| 5,605,852 A | 2/1997 | Bencuya |
| 5,614,751 A * | 3/1997 | Yilmaz et al. ............. 257/394 |
| 5,616,945 A | 4/1997 | Williams |
| 5,623,152 A | 4/1997 | Majumdar et al. |
| 5,629,543 A | 5/1997 | Hshieh et al. |
| 5,635,419 A * | 6/1997 | Geiss et al. ................ 438/386 |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,719,409 A | 2/1998 | Singh et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,877,528 A | 3/1999 | So |
| 5,879,971 A | 3/1999 | Witek |
| 5,879,994 A | 3/1999 | Kwan et al. |
| 5,895,951 A | 4/1999 | So et al. |
| 5,895,243 A | 4/1999 | Darwish et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,917,216 A | 6/1999 | Floyd et al. |
| 5,929,481 A | 7/1999 | Hshieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,081,009 A | 6/2000 | Neilson |

6,084,264 A 7/2000 Darwish
6,084,268 A 7/2000 de Frésart et al.
6,087,232 A 7/2000 Kim et al.
6,096,608 A 8/2000 Williams
6,097,063 A 8/2000 Fujihira
6,103,578 A 8/2000 Uenishi et al.
6,104,054 A 8/2000 Corsi et al.
6,110,799 A 8/2000 Huang
6,114,727 A 9/2000 Ogura et al.
6,137,152 A 10/2000 Wu
6,150,697 A 11/2000 Teshigahara et al.
6,156,606 A 12/2000 Michaelis
6,156,611 A 12/2000 Lan et al.
6,163,052 A 12/2000 Liu et al.
6,165,870 A 12/2000 Shim et al.
6,168,983 B1 1/2001 Rumennik et al.
6,168,996 B1 1/2001 Numazawa et al.
6,171,935 B1 1/2001 Nance et al.
6,174,773 B1 1/2001 Fujishima
6,174,785 B1 1/2001 Parekh et al.
6,184,545 B1 2/2001 Werner et al.
6,184,555 B1 2/2001 Tihanyi et al.
6,188,104 B1 2/2001 Choi et al.
6,188,105 B1 2/2001 Kocon et al.
6,190,978 B1 2/2001 D'Anna
6,191,447 B1 2/2001 Baliga
6,194,741 B1 2/2001 Kinzer et al.
6,198,127 B1 3/2001 Kocon
6,201,279 B1 3/2001 Pfirsch
6,204,097 B1 3/2001 Shen et al.
6,207,994 B1 3/2001 Rumennik et al.
6,222,233 B1 4/2001 D'Anna
6,225,649 B1 5/2001 Minato
6,228,727 B1 5/2001 Lim et al.
6,239,463 B1 5/2001 Williams et al.
6,239,464 B1 5/2001 Tsuchitani et al.
6,242,770 B1 * 6/2001 Bronner et al. ............. 257/295
6,262,453 B1 * 7/2001 Hshieh ....................... 257/341
6,265,269 B1 7/2001 Chen et al.
6,271,100 B1 8/2001 Ballantine et al.
6,271,552 B1 8/2001 D'Anna
6,271,562 B1 8/2001 Deboy et al.
6,274,904 B1 8/2001 Tihanyi
6,274,905 B1 8/2001 Mo
6,277,706 B1 8/2001 Ishikawa
6,281,547 B1 8/2001 So et al.
6,285,060 B1 9/2001 Korec et al.
6,291,298 B1 9/2001 Williams et al.
6,291,856 B1 9/2001 Miyasaka et al.
6,294,818 B1 9/2001 Fujihira
6,297,534 B1 10/2001 Kawaguchi et al.
6,303,969 B1 10/2001 Tan
6,307,246 B1 10/2001 Nitta et al.
6,309,920 B1 10/2001 Laska et al.
6,313,482 B1 11/2001 Baliga
6,316,806 B1 11/2001 Mo
6,326,656 B1 12/2001 Tihanyi
6,337,499 B1 1/2002 Werner
6,346,464 B1 2/2002 Takeda et al.
6,346,469 B1 2/2002 Greer
6,351,018 B1 2/2002 Sapp
6,353,252 B1 3/2002 Yasuhara et al.
6,359,308 B1 3/2002 Hijzen et al.
6,362,112 B1 3/2002 Hamerski
6,362,505 B1 3/2002 Tihanyi
6,365,462 B2 4/2002 Baliga
6,365,930 B1 4/2002 Schillaci et al.
6,368,920 B1 4/2002 Beasom
6,368,921 B1 4/2002 Hijzen et al.
6,376,314 B1 4/2002 Jerred
6,376,878 B1 4/2002 Kocon
6,376,890 B1 4/2002 Tihanyi
6,384,456 B1 5/2002 Tihanyi
6,388,286 B1 5/2002 Baliga
6,388,287 B2 5/2002 Deboy et al.
6,400,003 B1 6/2002 Huang
6,420,770 B1 * 7/2002 Xiang et al. ................ 257/506
6,429,481 B1 * 8/2002 Mo et al. .................... 257/341
6,433,385 B1 8/2002 Kocon et al.
6,436,779 B2 8/2002 Hurkx et al.
6,437,399 B1 8/2002 Huang
6,441,454 B2 8/2002 Hijzen et al.
6,452,230 B1 9/2002 Boden, Jr.
6,465,304 B1 10/2002 Blanchard et al.
6,465,843 B1 10/2002 Hirler et al.
6,465,869 B2 10/2002 Ahlers et al.
6,472,678 B1 10/2002 Hshieh et al.
6,472,708 B1 10/2002 Hshieh et al.
6,475,884 B2 11/2002 Hshieh et al.
6,476,443 B1 11/2002 Kinzer
6,479,352 B2 11/2002 Blanchard
6,489,652 B1 12/2002 Jeon et al.
6,501,146 B1 12/2002 Harada
6,570,185 B1 * 5/2003 Tan ............................ 257/77
6,579,782 B2 * 6/2003 Roy ........................... 438/561
6,608,350 B2 * 8/2003 Kinzer et al. ............... 257/341
6,710,406 B2 * 3/2004 Mo et al. .................... 257/341
6,803,626 B2 * 10/2004 Sapp et al. ................ 257/329
2001/0023961 A1 9/2001 Hsieh et al.
2001/0028083 A1 10/2001 Onishi et al.
2001/0032998 A1 10/2001 Iwamoto et al.
2001/0041400 A1 11/2001 Ren et al.
2001/0049167 A1 12/2001 Madson
2001/0050394 A1 12/2001 Onishi et al.
2002/0003266 A1 * 1/2002 Manning .................... 257/372
2002/0009832 A1 1/2002 Blanchard
2002/0014658 A1 2/2002 Blanchard
2002/0066924 A1 6/2002 Blanchard
2002/0070418 A1 6/2002 Kinzer et al.
2002/0100933 A1 8/2002 Marchant
2003/0060013 A1 3/2003 Marchant
2003/0073287 A1 * 4/2003 Kocon ........................ 438/259
2003/0132450 A1 7/2003 Minato et al.
2003/0193067 A1 10/2003 Kim

FOREIGN PATENT DOCUMENTS

DE 4300806 C1 12/1993
DE 19736981 A1 8/1998
EP 975024 A2 1/2000
EP 1026749 A1 8/2000
EP 1054451 A2 11/2000
EP 747967 B1 2/2002
EP 1205980 A1 5/2002
JP 62-069562 3/1987
JP 63-186475 8/1988
JP 63-288047 11/1988
JP 64-022051 1/1989
JP 01-192174 A 8/1989
JP 5226638 A 9/1993
JP 2000-040822 2/2000
JP 2000-040872 2/2000
JP 2000-156978 A 6/2000
JP 2000-277726 A 10/2000
JP 2000-277728 A 10/2000
JP 2001-015448 1/2001
JP 2001-015752 1/2001
JP 2001-102577 A 4/2001
JP 2001-111041 A 4/2001
JP 2001-135819 A 5/2001
JP 2001-144292 A 5/2001
JP 2001-244461 A 9/2001
JP 2001-313391 A 12/2001
JP 2002-083976 A 3/2002
WO WO 00/33386 A2 6/2000
WO WO 00/68997 A1 11/2000

| | | |
|---|---|---|
| WO | WO 00/68998 A1 | 11/2000 |
| WO | WO 00/75965 A2 | 12/2000 |
| WO | WO 01/06550 A1 | 1/2001 |
| WO | WO 01/06557 A1 | 1/2001 |
| WO | WO 01/45155 A1 | 6/2001 |
| WO | WO 01/59847 A2 | 8/2001 |
| WO | WO 01/71815 | 9/2001 |
| WO | WO 01/95385 A1 | 12/2001 |
| WO | WO 01/95398 A1 | 12/2001 |
| WO | WO 02/01644 A2 | 1/2002 |
| WO | WO 02/047171 A1 | 6/2002 |

OTHER PUBLICATIONS

Baliga "New Concepts in Power Rectifiers," Physics of Semiconductor Devices, Proceedings of the Third Int'l Workshop, Madras (India), Committee on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Performance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1mΩ cm2," IEEE Transactions on Electron Devices 34:2329-2334 (1987).

Cheng et al., "Fast reverse recovery body diode in high-voltage VDMOSFET using cell-distributed schottky contacts," (May 2003) *IEEE Transactions on Electron Devices*, vol. 50, No. 5, pp. 1422-1425.

"CoolMOSä the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) *Proc. IEEE Power Electronics Specialist Conf. (PESC)*, pp. 1248-1254.

Fujihira "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al. "A Novel Vertical Deep Trench RESURF DMOS (VTR-DMOS)" IEEE ISPD 2000, May 22-25, Toulouse France, pp. 197-200.

"IR develops CoolMOSä -equivalent technology, postitions it at the top of a 3-tiered line of new products for SMPS," International Rectifiers company information available at http://www.irf.com (1999) 3 pages total.

Kao et al. "Two Dimensional Thermal Oxidation of Silicon-I. Experiments,", *IEEE Transactions on Electron Devices*, vol. ED-34,No. 5, May 1987, pp. 1008-1017.

Kao et al. "Two Dimensional Thermal Oxidation of Silicon-II. Modeling Stress Effects in Wet Oxides," *IEEE Transactions on Electron Devices*, vol. ED-35, No. 1, Jan. 1988, pp. 25-37.

Kassakian, J.G. et al., "High-frequency high-density converters for distributed power supply systems," (Apr. 1988) *Proceedings of the IEEE*, vol. 76, No. 4, pp. 362-376.

Korman, C.S. et al., "High performance power DMOSFET with integrated schottky diode," (1989) *Proc. IEEE Power Electronics Specialist Conf. (PESC)*, pp. 176-179.

Lorenz et al., "COOL MOS- An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf. (PESC)*, pp. 769-779.

Technical Literature from Quester Technology, Model APT-4300 300mm Atmospheric TEOS/Ozone CVD System, (unknown date), 3 pages total.

Technical Literature from Quester Technology, Model APT-6000 Atmospheric TEOS-Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

* cited by examiner

VERTICAL CHARGE CONTROL SEMICONDUCTOR DEVICE WITH LOW OUTPUT CAPACITANCE

CROSS-REFERENCE TO RELATED APPLICATIONS

This application is a division of and claims priority to U.S. application Ser. No. 10/200,056, filed Jul. 18, 2002 now U.S. Pat. No. 6,803,626, which disclosure is incorporated herein by reference for all purposes.

BACKGROUND OF THE INVENTION

Power field effect transistors, e.g., MOSFETs (metal oxide semiconductor field effect transistors), are well-known in the semiconductor industry. One type of power MOSFET is a DMOS (double-diffused metal oxide semiconductor) transistor. A cross-sectional view of a portion of a cell array of one known variety of DMOS transistors is shown in FIG. 1. As shown, an n-type epitaxial layer 102 overlies n-type substrate region 100 to which the drain contact is made. Polysilicon-filled trenches extend into the epitaxial layer 102 from the top surface. The polysilicon 106a, 106b in the trenches are insulated from the epitaxial layer by oxide layers 104a, 104b. Source regions 108a, 108b in p-type body regions 110a, 110b are adjacent the trenches at the top surface. A polysilicon gate 114 overlaps the source regions 108a,b, extends over a surface portion of the body regions 110a,b, and extends over a surface area of a region between the two trenches commonly referred to as the mesa drift region. Metal layer 116 electrically shorts source regions 108a,b to body regions 110a,b and polysilicon 106a,b in the trenches. The surface area of body regions 110a,b directly underneath gate 114 defines the transistor channel region. The area between body regions 110a and 110b under gate 114 is commonly referred to as the JFET region.

Upon applying a positive voltage to the gate and the drain, and grounding the source and the body regions, the channel region is inverted. A current thus starts to flow from the drain to the source through the drift region and the surface channel region.

A maximum forward blocking voltage, hereinafter referred to as "the breakdown voltage", is determined by the avalanche breakdown voltage of a reverse-biased body-drain junction. The DMOS structure in FIG. 1 has a high breakdown voltage due to the polysilicon-filled trenches. Polysilicon 106a,b cause the depletion layer formed as a result of the reverse-biased body-drain junction to be pushed deeper into the drift region. By increasing the depletion region depth without increasing the electric field, the breakdown voltage is increased without having to resort to reducing the doping concentration in the drift region which would otherwise increase the transistor on-resistance.

A drawback of the FIG. 1 structure is its high output capacitance Coss, making this structure less attractive for high frequency applications such as radio frequency (RF) devices for power amplifiers in the wireless communication base stations. The output capacitance Coss of the FIG. 1 structure is primarily made up of: (i) the capacitance across the oxide between the polysilicon in the trenches and the drift region (i.e., Cox), in series with (ii) the capacitance across the depletion region at the body-drift region junction. Cox is a fixed capacitance while the depletion capacitance is inversely proportional to the body-drain bias.

The breakdown voltage of power MOSFETs is dependent not only upon the cell structure but also on the manner in which the device is terminated at its outer edges. To achieve a high breakdown voltage for the device as a whole, the breakdown voltage at the outer edges must be at least as high as that for the cells. Thus, for any cell structure, a corresponding terminating structure is needed which exhibits a high breakdown voltage.

In most amplifier circuits a significant amount of heat energy is produced in the transistor. Only 50% efficiency is typical of the best class AB RF power amplifiers available. An important factor in designing power devices for high frequency applications is thus the thermal performance of the device. Because of the different device performance requirements, the cells in power MOSFETs are densely packed resulting in concentration of heat in active regions and poor heat transfer rates. The increase in temperature resulting from the poor heat transfer rate adversely effects the device performance.

Thus, a power MOSFET device with such improved characteristics as low output capacitance, high breakdown voltage, and improved thermal performance is desired.

BRIEF SUMMARY OF THE INVENTION

In accordance with the present invention, MOSFET cell structures and edge termination structures, and methods of manufacturing the same, are described which among other features and advantages exhibit a substantially reduced output capacitance, high breakdown voltage, and improved thermal performance.

In one embodiment, a MOSFET comprises at least two insulation-filled trench regions laterally spaced in a first semiconductor region to form a drift region therebetween, and at least one resistive element located along an outer periphery of each of the two insulation-filled trench regions. A ratio of a width of each of the insulation-filled trench regions to a width of the drift region is adjusted so that an output capacitance of the MOSFET is minimized.

In another embodiment, a MOSFET comprises a first semiconductor region having a first surface, a first trench region extending from the first surface into the first semiconductor region, and at least one floating discontinuous region along a sidewall of the first trench region.

In another embodiment, a MOSFET comprises a first semiconductor region having a first surface, a first trench region extending from the first surface into the first semiconductor region, and a first plurality of regions along a sidewall of the first trench region.

In another embodiment, a MOSFET comprises a first semiconductor region having a first surface, and first and second insulation-filled trench regions each extending from the first surface into the first semiconductor region. Each of the first and second insulation-filled trench regions has an outer layer of silicon of a conductivity type opposite that of the first semiconductor region. The first and second insulation-filled trench regions are spaced apart in the first semiconductor region to form a drift region therebetween such that the volume of each of the first and second trench regions is greater than one-quarter of the volume of the drift region.

In another embodiment, a MOSFET comprises a first semiconductor region over a substrate. The first semiconductor region has a first surface. The MOSFET further includes first and second insulation-filled trench regions each extending from the first surface to a predetermined depth within the first semiconductor region. Each of the first and second insulation-filled trench regions has an outer layer of doped silicon material which is discontinuous along a bottom surface of the insulation-filled trench region so that the insulation material along the bottom surface of the insulation-filled trench region is in direct contact with the first semiconductor region. The outer layer of silicon material is of a conductivity type opposite that of the first semiconductor region.

In another embodiment, a MOSFET comprises a first semiconductor region having a first surface, a first insulation-filled trench region extending from the first surface into the first semiconductor region, and strips of semi-insulating material along the sidewalls of the first insulation-filled trench region. The strips of semi-insulating material are insulated from the first semiconductor region.

In accordance with an embodiment of the present invention, a MOSFET is formed as follows. A first epitaxial layer is formed over a substrate. A first doped region is formed in the first epitaxial layer. The first doped region has a conductivity type opposite that of the first epitaxial layer. A second epitaxial layer is formed over the first doped region and the first epitaxial region. A first trench region is formed which extends from a surface of the second epitaxial layer through the first and second epitaxial layers and the first doped region such that the first doped region is divided into two floating discontinuous regions along sidewalls of the first trench region.

In another embodiment, a MOSFET is formed as follows. A first epitaxial layer is formed over a substrate. First and second doped regions are formed in the first epitaxial layer. The first and second doped regions have a conductivity type opposite that of the first epitaxial layer. A second epitaxial layer is formed over the first and second doped regions and the first epitaxial region. First and second trench regions are formed wherein the first trench region extends through the first and second epitaxial layers and the first doped region such that the first doped region is divided into two floating discontinuous regions along sidewalls of the first trench region, and the second trench region extends through the first and second epitaxial layers and the second doped region such that the second doped region is divided into two floating discontinuous regions along sidewalls of the second trench region.

In another embodiment, a MOSFET is formed as follows. A first trench is formed in a first semiconductor region. A first doped region is formed along a bottom of the first trench. The first trench is extended deeper into the first semiconductor region such that of the first doped region two floating discontinuous regions remain along sidewalls of the first trench.

In another embodiment, a MOSFET is formed as follows. A first semiconductor region is formed over a substrate. The first semiconductor region has a first surface. A first trench is formed which extends from the first surface to a predetermined depth within the first semiconductor region. A layer of doped silicon material is formed along sidewalls of the trench. The layer of doped silicon material is of a conductivity type opposite that of the first semiconductor region.

The following detailed description and the accompanying drawings provide a better understanding of the nature and advantages of the present invention.

BRIEF DESCRIPTION OF THE DRAWINGS

FIGS. 3-2a through 3-2c are cross-sectional views showing another exemplary set of process steps for forming the structure in FIG. 2;

DETAILED DESCRIPTION OF THE INVENTION

MOSFET cell structures, edge termination structures, and methods of manufacturing the same are described in accordance with the present invention. Among other features and advantages, the cell and termination structures and methods of manufacturing the same exhibit a substantially reduced output capacitance, high breakdown voltage, and improved thermal performance.

Figure 2:
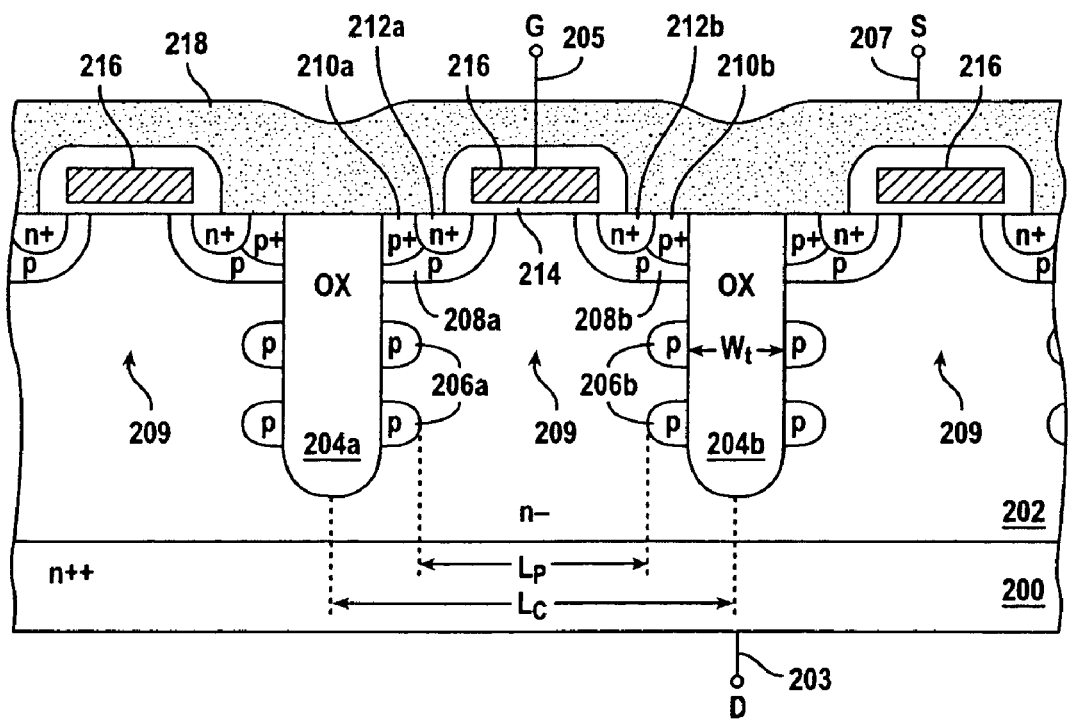
FIG. 2 shows a cross-sectional view of a cell array with floating p regions in accordance with one embodiment of the present invention.

FIG. 2 shows a cross-sectional view of a power MOSFET cell array in accordance with an embodiment of the present invention. As shown, both gate terminal 205 and source terminal 207 are located along the top-side of the device, and drain terminal 203 is located along the bottom-side. Drain terminal 203 is coupled to the lightly-doped epitaxial region 202 through a highly doped region 200 serving as the drain contact. Oxide-filled trench regions 204a, 204b extend from the top-side to a predetermined depth in the epitaxial region 202. Discontinuous floating p-type regions 206a, 206b are spaced along an outer sidewall of trench regions 204a,b. P-type body regions 208a, 208b extend from the top-side into the epitaxial region adjacent trench regions 204a,b. As shown, body regions 208a,b include highly-doped p+ regions 210a,b, although these p+ regions may be eliminated if desired. Source regions 212a,b are formed in body regions 208a,b as shown.

Polysilicon gates 216 overlap source regions 212a,b, extend over the surface area of body regions 208a,b and over the surface area of epitaxial region 202 between body regions 208a and 208b. Gates 216 are insulated from the underlying regions by gate oxide 214. The surface area of body regions 208a,b directly under gates 216 form the channel regions. Metal layer 218 overlies the top-side of the structure and forms the common source-body contact.

The area of the epitaxial region between trenches 204a and 204b is hereinafter referred to as drift region 209. When proper biasing is applied to the gate, drain, and source terminals to turn on the device, current flows between drain terminal 203 and source terminal 207 through drain contact region 200, drift regions 209, the channel regions, source diffusion regions 212a,b, and finally metal layer 218.

Figure 1:
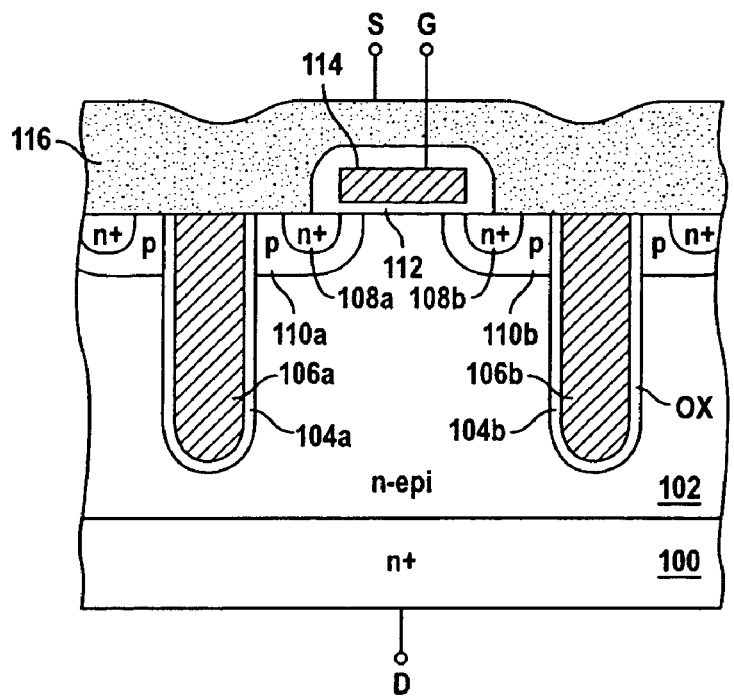
FIG. 1 shows a cross-sectional view of a cell array of a known n-channel DMOS transistor.

Comparing FIGS. 1 and 2, it can be seen that the polysilicon 106a,b (FIG. 1) in the trenches are replaced with insulating material, thus eliminating the significant contributor to the output capacitance of the FIG. 1 structure, namely, Cox. By replacing the polysilicon with an insulator such as silicon-dioxide, a greater portion of the space charge region appears across an insulator rather than silicon. Because the permitivity of insulator is lower than that of silicon (in the case of silicon-dioxide, a factor of about three lower), and the area of the space charge region along its boundaries is reduced (especially when the application voltage is low), the output capacitance is significantly reduced (by at least a factor of three).

As described above, the polysilicon in the trenches of the prior art FIG. 1 structure helps improve the cell breakdown voltage by pushing the depletion region deeper into the drift region. Eliminating the polysilicon would thus result in lowering the breakdown voltage unless other means of reducing the electric field are employed. Floating p regions 206a,b serve to reduce the electric field. In FIG. 2, as the electric field increases with the increasing drain voltage, floating p regions 206a,b acquire a corresponding potential determined by their position in the space charge region. The floating potential of these p regions causes the electric field to spread deeper into the drift region resulting in a more uniform field throughout the depth of the drift region and thus in a higher breakdown voltage. Accordingly, similar breakdown voltage characteristics to that of the FIG. 1 structure is achieved but with much reduced output capacitance.

Floating p regions 206a,b have the adverse effect of reducing the width of drift regions 209 through which current flows when the device is in the on-state, and thus result in increased on-resistance. However, the adverse impact of the floating p regions on the on-resistance can be reduced by obtaining an optimum balance between the charge concentration in the drift region and such features of the floating p regions as size, doping concentration, and the spacing Lp between them. For example, a higher charge concentration in the drift region would require a smaller spacing Lp and vice versa. Further, because the floating p regions reduce the electric field near the surface in the channel, the channel length can be reduced to improve the on-resistance and the general performance of the device as a high frequency amplifier.

In one embodiment wherein a breakdown voltage of 80-100V is desired, epitaxial region 202 has a doping concentration in the range of $5 \times 10^{15}$ to $1 \times 10^{16}$ cm-3 and the floating p regions 206a,b have a doping concentration of about 5-10 times that of the epitaxial region.

Figures 1A, 3:
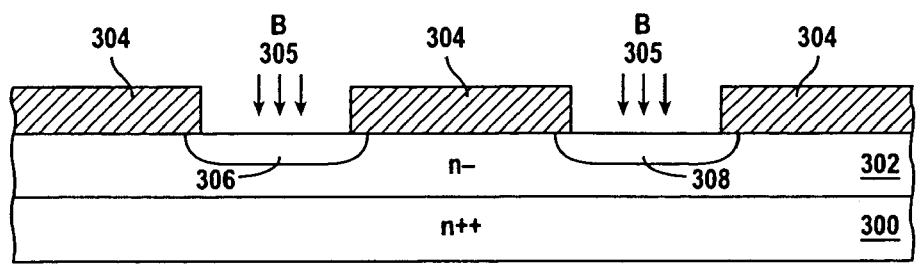
FIGS. 3-1a through 3-1e are cross-sectional views showing an exemplary set of process steps for forming the structure in FIG. 2.
Figures 1B, 3:
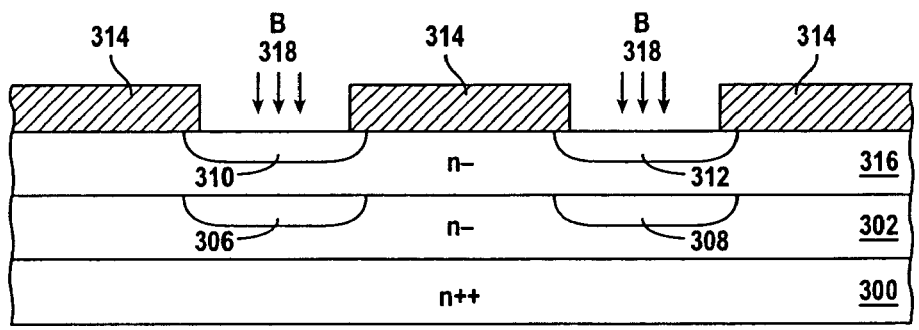
Figures 1C, 3:
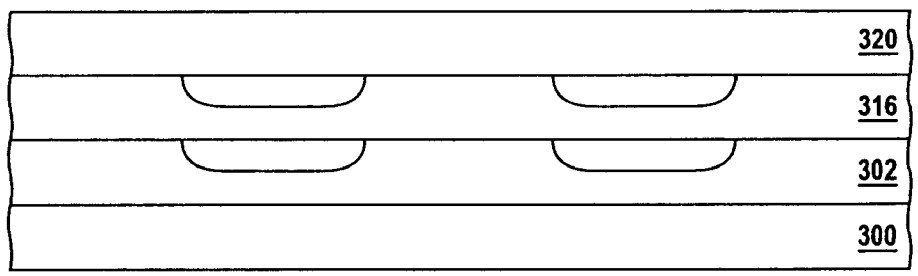
Figures 1D, 3:
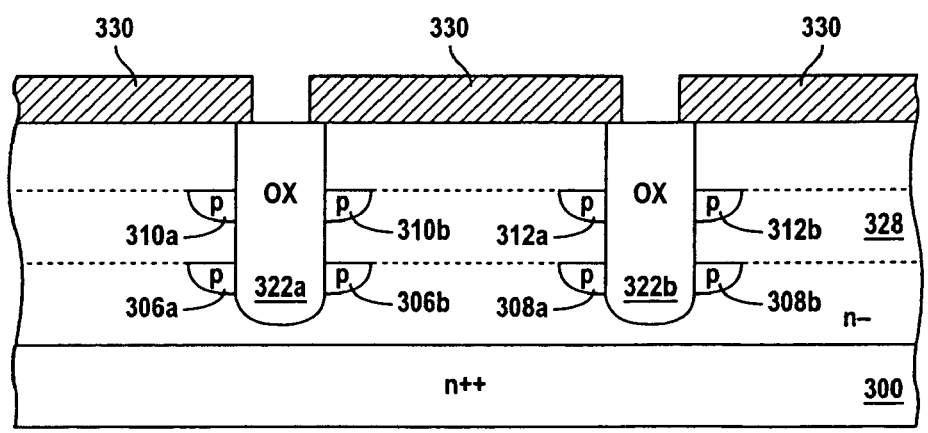
Figures 1E, 3:
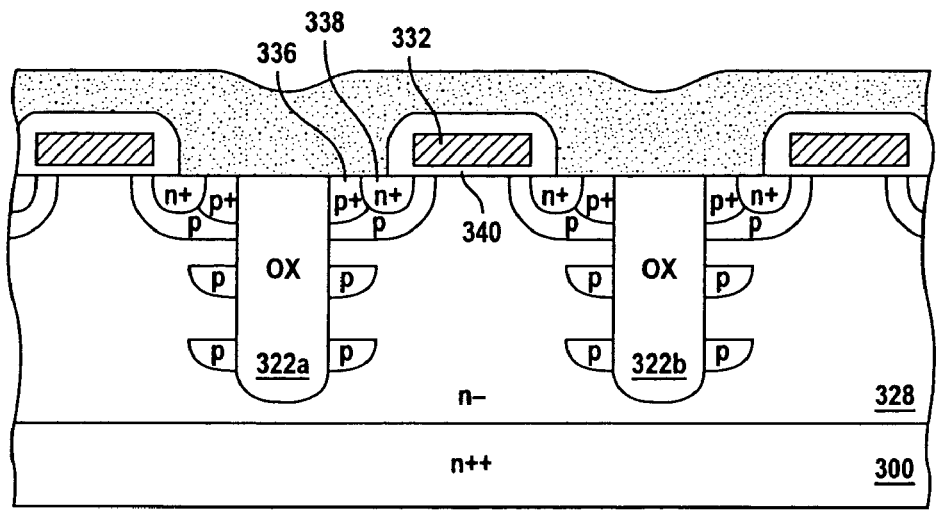

FIGS. 3-1a through 3-1e are cross-sectional views showing an exemplary set of process steps for forming the structure in FIG. 2. In FIG. 3-1a, a first n-epitaxial layer 302 is deposited on a heavily-doped substrate 300 using conventional methods. P regions 306, 308 are formed by implanting p-type impurities (such as Boron) through a mask 304. The size of the opening in mask 304 is dependent upon the desired width of the trenches and the desired width of the floating p regions which are in turn dictated by the device performance targets. In one embodiment, the target width of the trench is in the range of 1-5 μm, the width of p regions 306, 308 is at least 1 μm wider than the trench width, the lateral spacing between adjacent p regions 306 and 308 is no less than 1 μm, and n-epitaxial layer 302 has a doping concentration of about $2 \times 10^{16}$ cm-3 and a thickness in the range of 2-5 μm.

In FIG. 3-1b, similar steps to those in FIG. 3-1a are carried out to from a second n-epitaxial layer 316 and p regions 310, 312. These steps can be repeated depending on the desired number of floating p regions. Alternatively, the steps in FIG. 3-1b may be eliminated to form only a single floating p region along each trench sidewall.

In FIG. 3-1c, a final epitaxial layer 320 to receive the device body and source regions is deposited. While the deposition technique used in forming epitaxial regions 302, 316, and 320 is the same, the doping concentration of each epitaxial region can be varied depending on the desired characteristics of the drift region. Similarly, p regions 306, 308 may be implanted to have a different doping concentration than p regions 310, 312 if desired.

In FIG. 3-1d, mask 330 and conventional silicon trench etching techniques are used to etch through the three epitaxial layers 302, 316, 320 and through the center portion of the p regions 306, 308, 310, 312 to form trenches 322a, 322b and corresponding floating p regions 306a,b,308a,b, 310a,b, and 312a,b. The width of the openings in mask 330 determines the width of the oxide trenches relative to the width of the floating p regions.

After preparation of the trench surface, a relatively thin insulator (e.g., about 300-500 Å of thermal oxide) is grown on the trench surface. Trenches 322a,b are then filled with a dielectric material such as silicon-dioxide using conventional conformal coating method and/or Spin-On Glass (SOG) method. Any low k dielectric to reduce the output capacitance may be used to fill trenches 322a,b. Conventional process steps used in forming self-aligned gate DMOS structures are then carried out to form the gate structure as shown in FIG. 3e.

Figures 2A, 3:
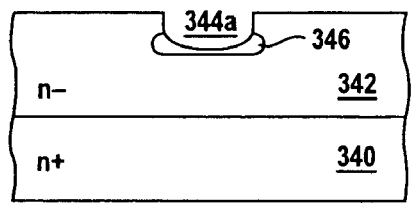
Figures 2B, 3:
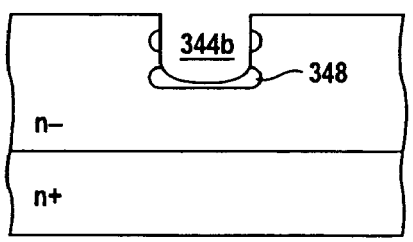
Figures 2C, 3:
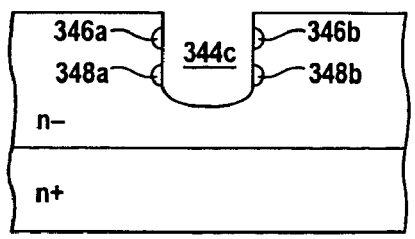

An alternate method of manufacturing the structure in FIG. 2 is described next using the simplified cross-sectional views in FIGS. 3-2a through 3-2c. In FIG. 3-2a: an initial n-epitaxial layer 342 is deposited on a heavily-doped substrate 340; a trench 344a is then formed in n-epitaxial layer 342; and an implant step is then carried out to form a p region 346 at the bottom of trench 344a, followed by a diffusion step to diffuse the p dopants further into epitaxial region 342. In FIG. 3-2b: trench 344a is further etched past p region 346 into epitaxial region 342 to form a deeper trench 344b; and similar implant and diffusion steps to those in FIG. 3-2a are carried out to form p region 348 at the bottom of trench 344b. In FIG. 3-2c: trench 344b is etched past p region 348 into epitaxial layer 342 to form an even deeper trench 344c; and trench 344c is then filled with a suitable insulator. Thus, an insulator-filled trench 344c and floating p regions 346a,b and 348a,b are formed. The remaining process steps would be similar to those described in connection with FIG. 3-1e.

Referring back to FIG. 2, the vertical charge control enabled by the floating p regions allows the cells to be laterally spaced apart without impacting the electrical characteristics of the device. With the cells spaced further apart, the heat generated by each cell is distributed over a larger area and less heat interaction occurs between adjacent cells. A lower device temperature is thus achieved.

To achieve effective vertical charge control, spacing Lp (FIG. 2) between adjacent floating p regions 206a and 206b needs to be carefully engineered. In one embodiment, spacing Lp is determined in accordance with the following proposition: the product of the doping concentration in the drift region and the spacing Lp be in the range of $2 \times 10^{12}$ to $4 \times 10^{12}$ cm-2. Thus, for example, for a drift region doping concentration of $5 \times 10^{15}$ cm-3, the spacing Lp needs to be about 4 μm. Once an optimum spacing Lp is determined, the spacing Lc between a center axis of adjacent trenches 204a,b can be independently increased without impacting the electrical characteristics of the device.

Figure 4:
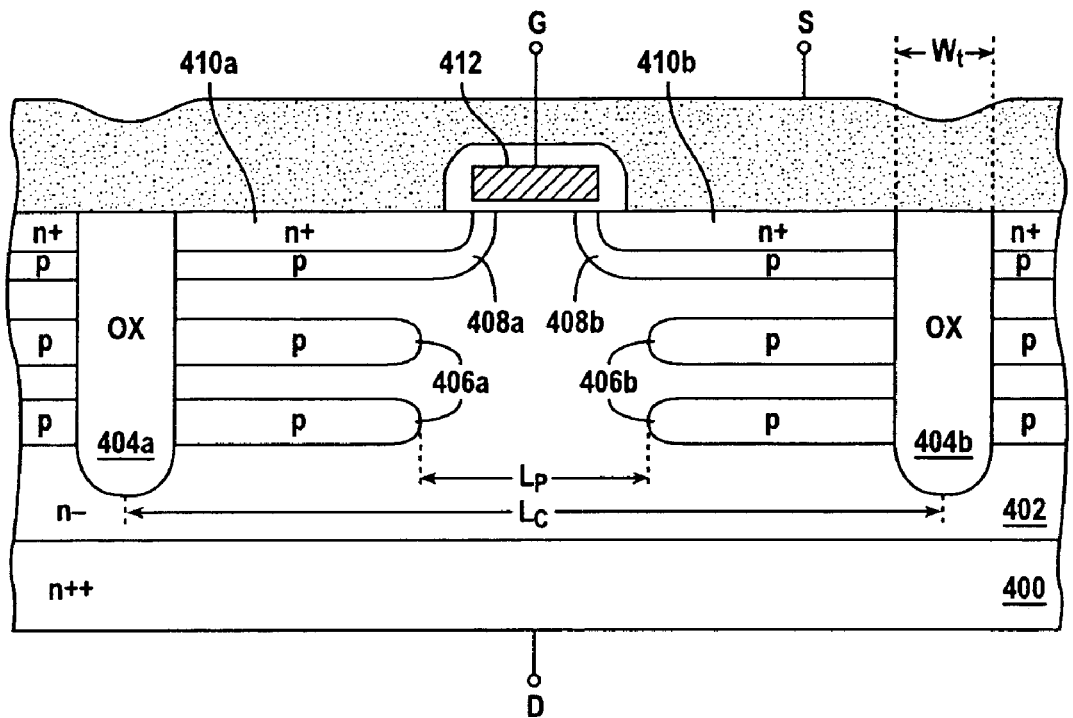
FIG. 4 shows a cross-sectional view of a cell array having elongated floating p regions in accordance with another embodiment of the present invention.
Figure 5:
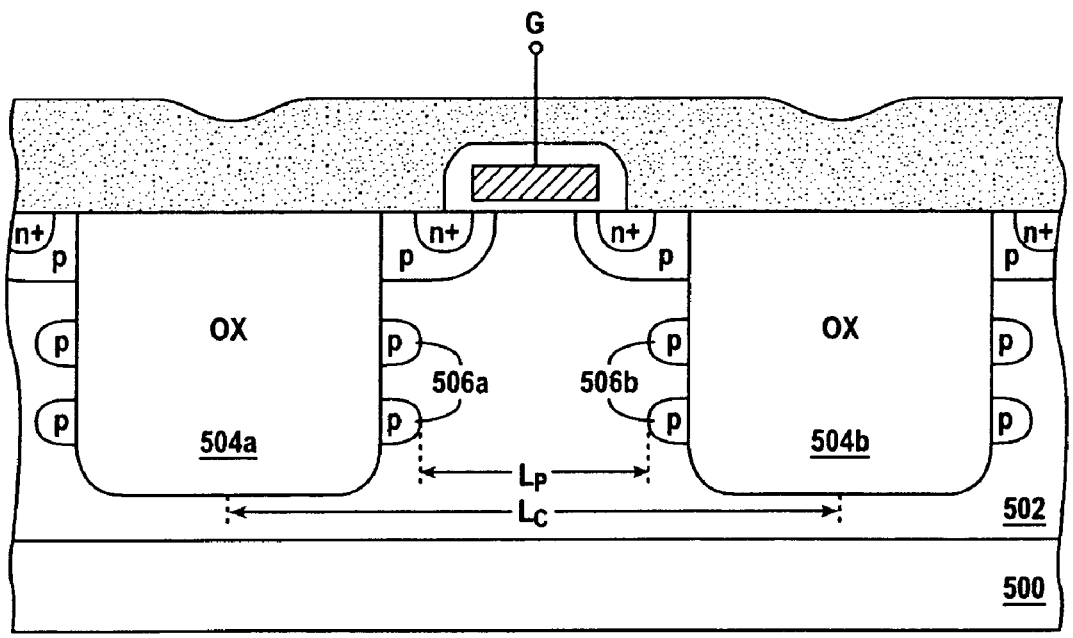
FIG. 5 shows a cross-sectional view of a cell array having a wide insulation-filled trench in accordance with yet another embodiment of the present invention.

Two ways of achieving the increased Lc spacing while keeping Lp spacing the same are shown in FIGS. 4 and 5. In FIG. 4, discontinuous floating p regions 406a,b along with the source and body regions are extended across a large portion of the area between adjacent trenches to achieve a larger Lc spacing. In one embodiment, a combined width Wt of one trench (e.g., 404b) and one of the first plurality of floating regions (e.g., 406b) is greater than one-quarter of the spacing Lp. The FIG. 4 embodiment is particularly useful in technologies where the trench width Wt is tightly limited to a maximum size. If the trench width is not tightly limited, then the width of the trenches can be increased to obtain a larger Lc spacing while keeping spacing Lp the same as shown in FIG. 5.

An advantage of the FIG. 5 structure over that in FIG. 4 is the lower output capacitance because of the smaller floating p regions, and because a larger portion of the depletion region occurs in the wider insulation-filled trenches. Thus, the reduction in output capacitance due to the wider size of the trenches can be promoted by designing the cell structure to have a high ratio of trench insulation volume to drift region volume. A wider trench also results in improved thermal performance. In one embodiment, the volume of the insulation in the trench is at least one-quarter of the volume of the drift region. Thus, the larger the trench volume, the lower the output capacitance and the better the thermal performance of the device. However, little is gained in making the trench wider than the thickness of the die (e.g., 100 μm).

Although FIGS. 2 through 5 show multiple floating p regions along the trench sidewalls, the invention is not limited as such. Depending on the device performance requirements and design goals, only a single floating p region may be formed along each sidewall of the trenches.

Figure 6:
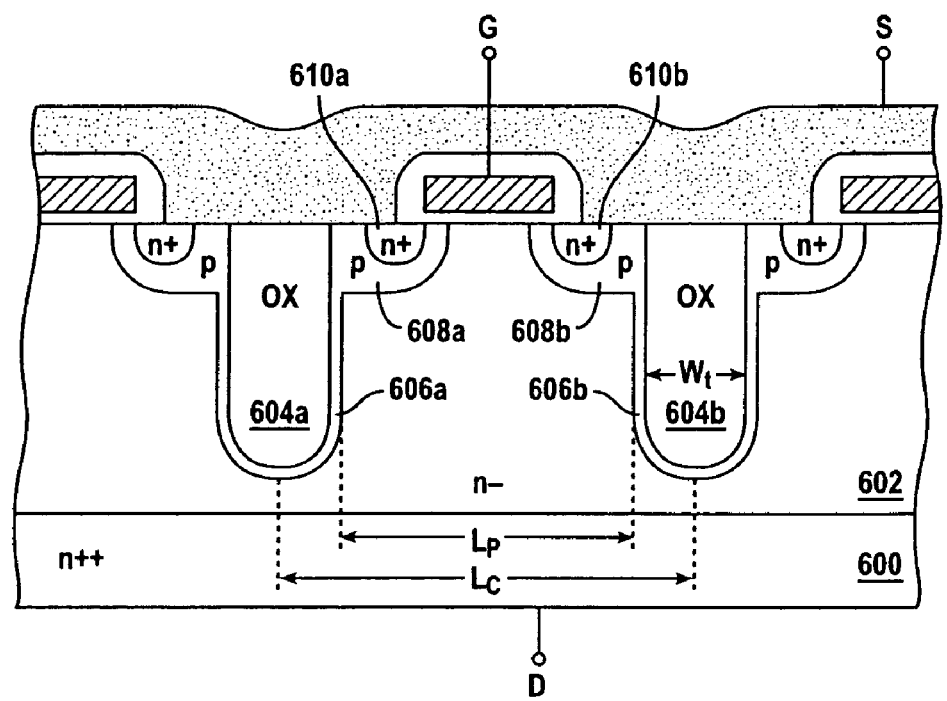
FIG. 6 shows a cross-sectional view of a cell array having insulation-filled trenches with a thin p layer along its outer perimeter in accordance with another embodiment of the present invention.

FIG. 6 shows a cross section view of a power MOSFET cell array in accordance with another embodiment of the present invention. The structure in FIG. 6 is similar to that in FIG. 2 except that floating p regions 206a,b (FIG. 2) are eliminated and p layers (or p liners) 606a,b are introduced along the outer perimeter of trenches 604a and 604b. Similar to floating p regions 206a,b, help spread the depletion region deeper into the drift regions, thus improving the breakdown voltage. P liners 606a,b are biased to the same potential as body regions 608a,b since they are in electrical contact with body regions 608a,b.

Figure 7:
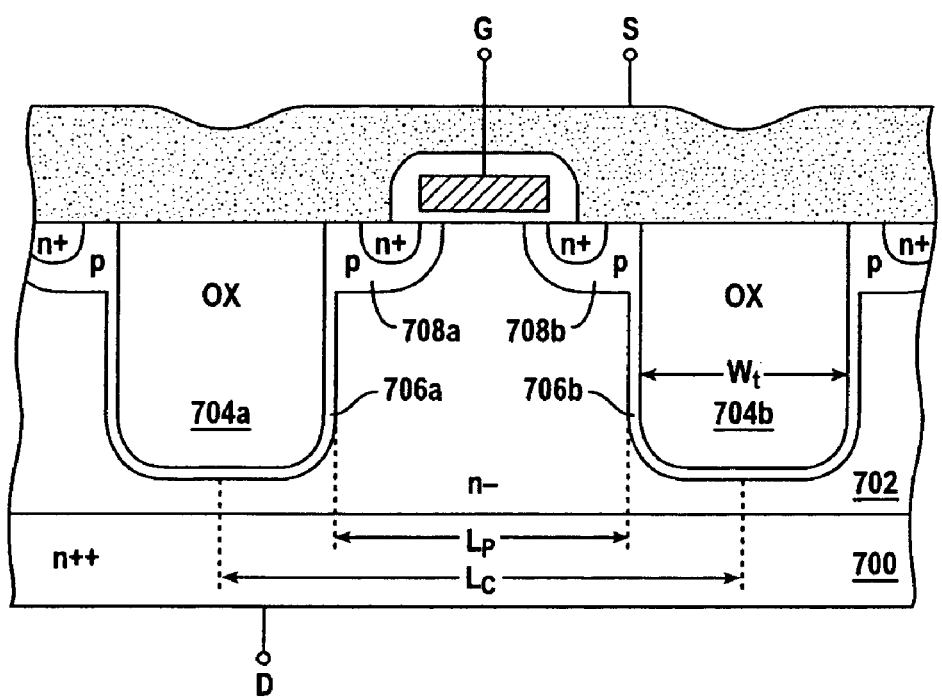
FIG. 7 shows a cross-sectional view of a cell array with wide trenches.
Figure 8:
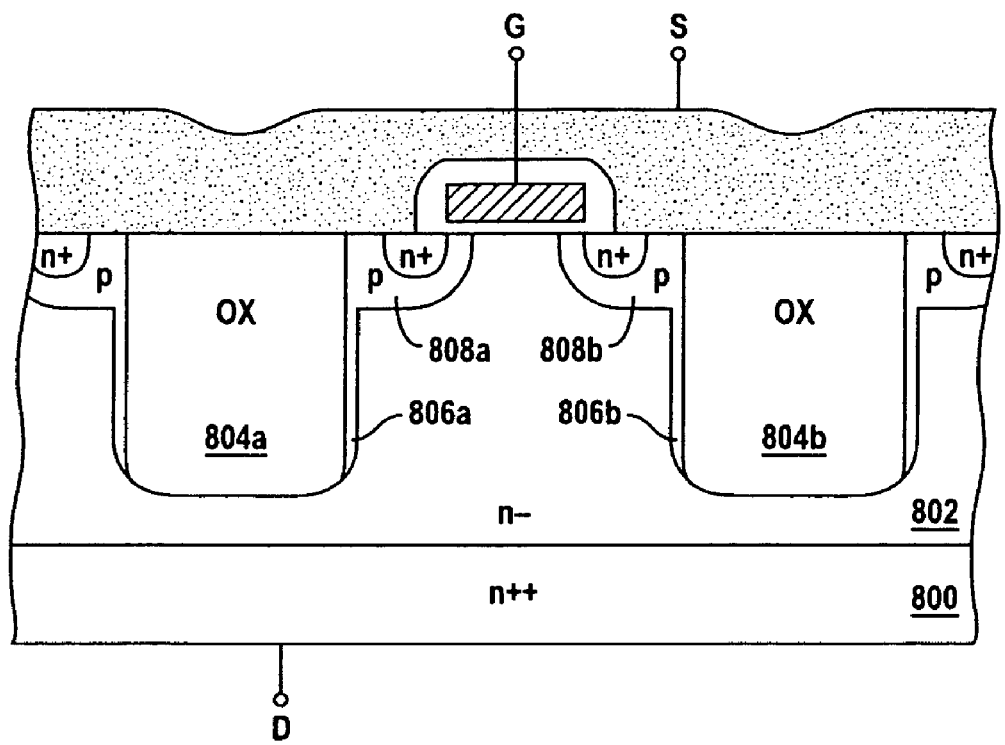
FIG. 8 shows a cross-sectional view of a cell array with p strips along sidewalls of the trenches, in accordance with another embodiment of the present invention.

In FIG. 7, as in FIG. 5, the width Wt of the oxide trench is increased to achieve improved thermal performance, while the Lp spacing is maintained at the same optimum value. A drawback of the FIG. 7 structure is that p liners 706a,b result in higher output capacitance since they cause the space charge region to follow the entire contour of the trench. One approach in reducing the p liners' contribution to the output capacitance is to eliminate that portion of the p liners extending across the bottom of the trenches, as shown in FIG. 8. In this manner, the output capacitance is reduced while the same breakdown voltage is maintained since p strips 806a,b (FIG. 8) spread the depletion region deeper into the drift regions.

Figure 9A:
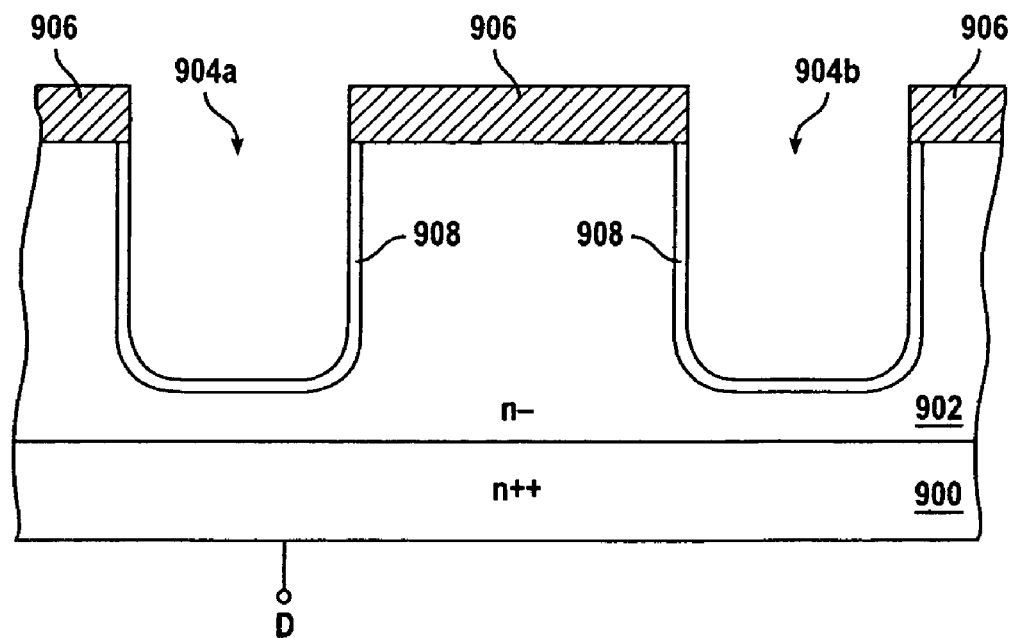
FIGS. 9a through 9c are cross-sectional views showing an exemplary set of process steps for forming the structure in FIG. 8.
Figure 9B:
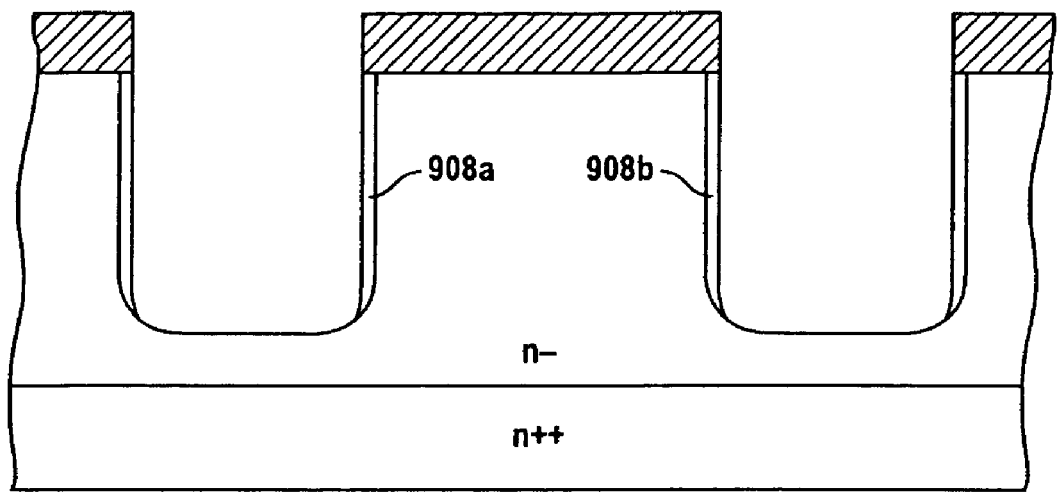
Figure 9C:
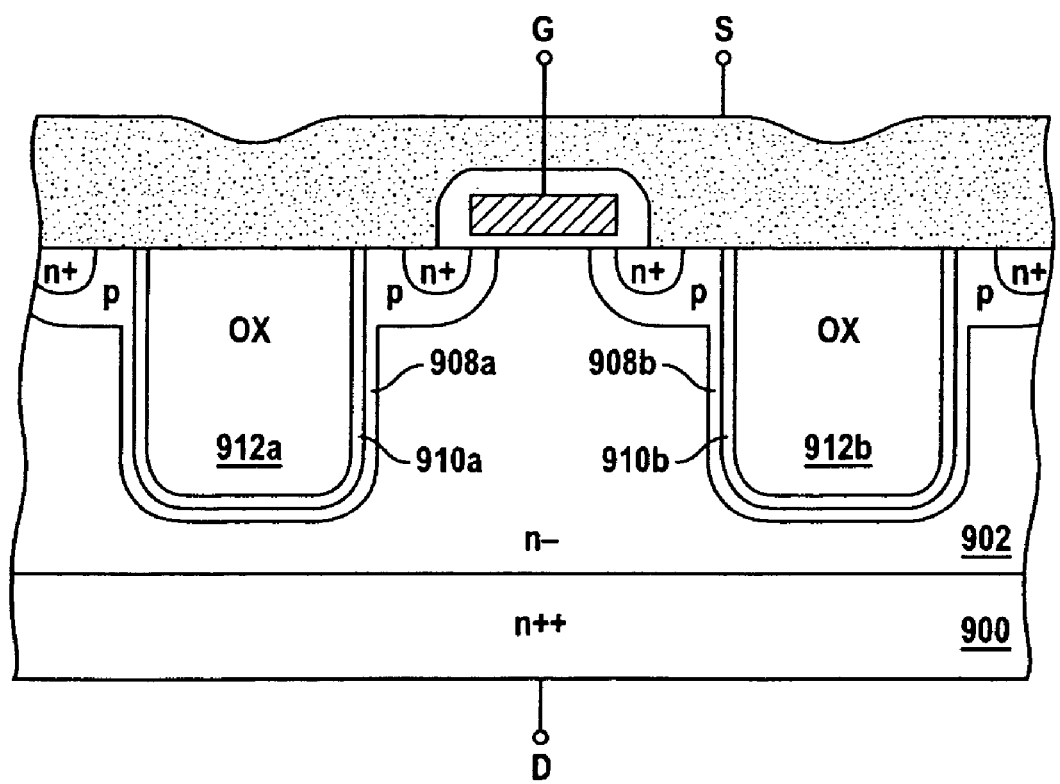

An exemplary set of process steps for forming the structure of FIG. 8 is shown in FIGS. 9a through 9c. In FIG. 9a, a hard mask 906 along with conventional silicon trench etch methods are used to etch epitaxial region 902 to form wide trenches 904a, 904b. Using the same mask, p liners 908 are formed by implanting p-type impurities at about a 45° angle into both sidewalls and bottom of the trenches using conventional methods. In FIG. 9b, conventional silicon etch method is carried out to remove the portion of the p liners along the bottom of the trenches, leaving p strips 908a,b along the sidewalls of the trenches. In FIG. 9c, a thermally-grown oxide layer 910a,b is formed along the inner sidewalls and bottom of each trench. The p-type dopants in p strips 908a,b are then activated using conventional methods. Conventional oxide deposition steps (e.g., SOG method) are carried out to fill the trenches with oxide, followed by planarization of the oxide surface. Conventional process steps used in forming the gate structure in self-aligned gate DMOS structures are then carried out to form the full structure as shown in FIG. 9c. Note that in the FIGS. 7 and 8 structures the thermally grown oxide liners, similar to those in FIG. 9c, are present but are not shown for simplicity. The thermally grown oxide layers are included to provide a cleaner interface between the trench insulator and the p strips.

From the above, it can be seen that manufacturing of the FIG. 8 structure is less complex than that of the FIG. 5 structure because of the extra steps required in forming the floating p regions in the FIG. 5 structure.

The doping concentration in the p liners/strips in FIGS. 6-8 impacts the output capacitance of each of these structures. Highly-doped p regions lead to higher output capacitance since a higher reverse bias potential is needed to fully deplete these p regions. Thus, a low doping concentration (e.g., of about $1 \times 10^{17}$ cm-3) would be desirable for these p regions. Note that these p regions have less effect on the output capacitance at high operating voltages.

Figure 10A:
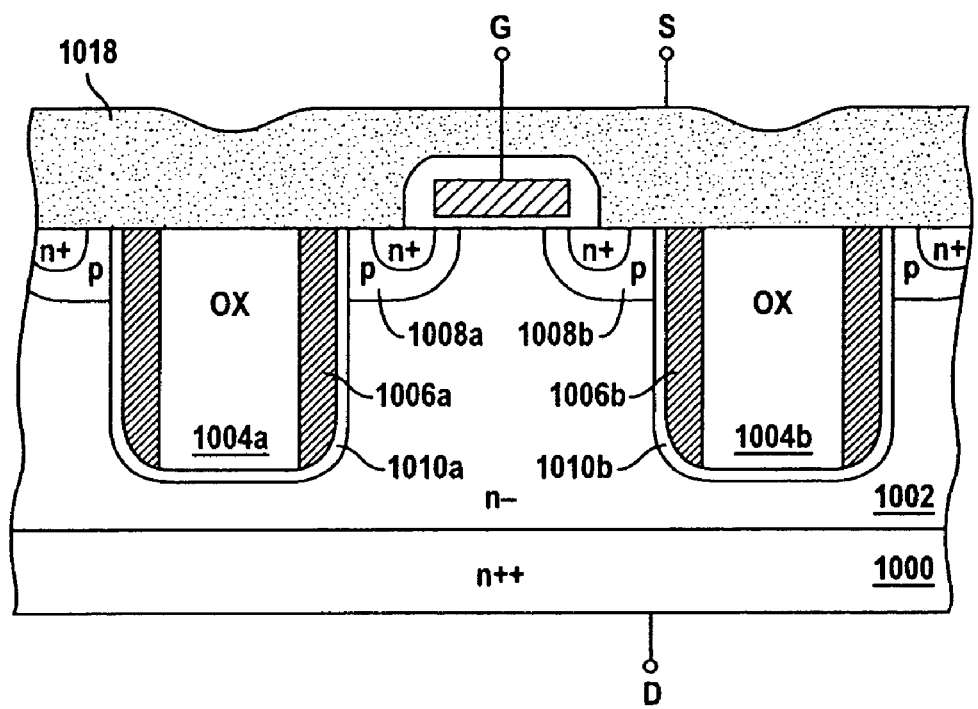
FIGS. 10a, 10b, and 10c show cross-sectional views of cell arrays having strips of semi-insulating material along sidewalls of trenches in accordance with three embodiments of the present invention.
Figure 10B:
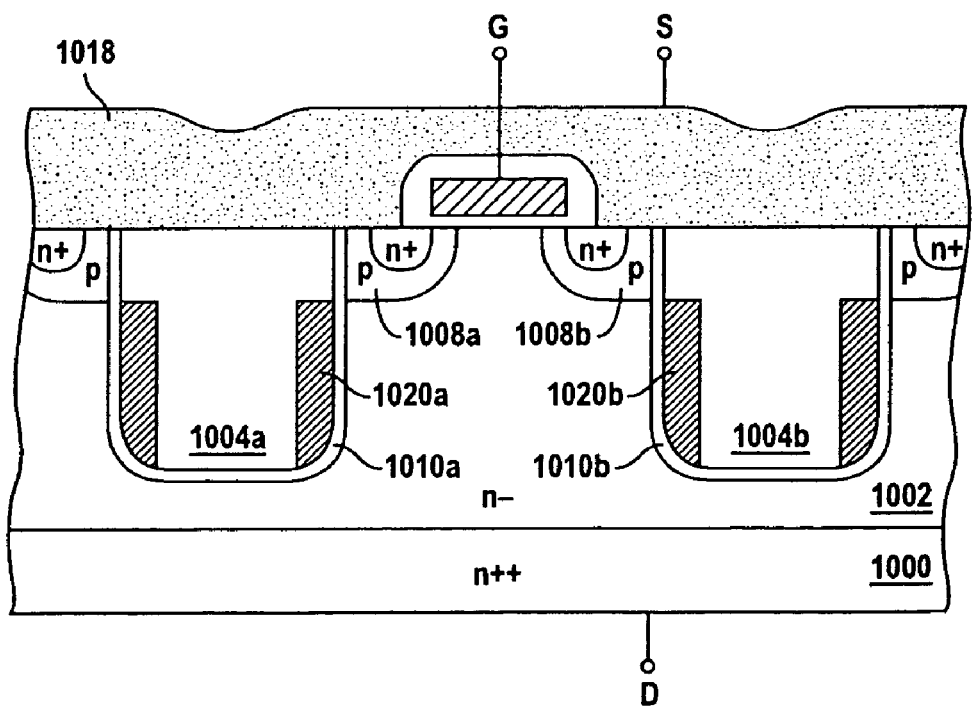
Figure 10C:
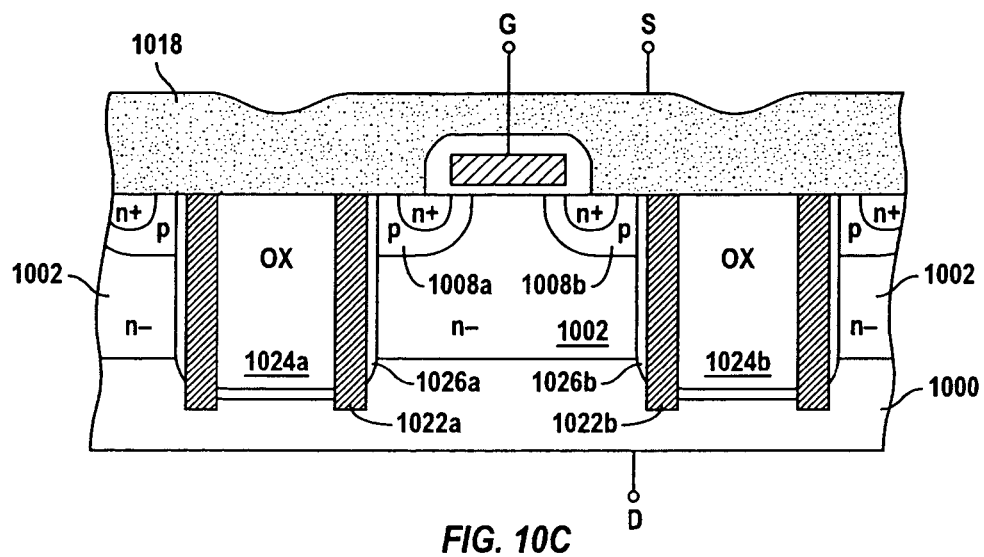

FIGS. 10a-10c show cross sectional views of three power MOSFET cell arrays each of which includes strips of semi-insulating material (e.g., oxygen-doped polysilicon SiPOS) along the trench sidewalls. In all three figures, wide insulation-filled trenches 1004a,b are used to achieve improved thermal performance as in previous embodiments. Also, the semi-insulating strips in these structures function similar to polysilicon 106a,b in the prior art FIG. 1 in pushing the depletion region deeper into the drift region, thus improving the breakdown voltage.

In FIG. 10a, strips 1006a,b of semi-insulating material extend along the trench sidewalls and are insulated from epitaxial region 1002 and body regions 1008a,b by a layer of insulating material 1010a,b. Strips 1006a,b are in electrical contact with the top metal layer 1018, and thus are biased to the same potential as the source and body regions.

In FIG. 10b, strips 1020a,b of semi-insulating material are integrated in the cell array in a similar manner to those in FIG. 10a except that strips 1020a,b are insulated from the top metal layer 1018 and thus are floating. During operation, the potential in the space charge region couples to the semi-insulating strips through insulation layers 1010a,b to bias the strips to a corresponding mostly uniform potential.

In FIG. 10c, the insulation-filled trenches 1024a,b extend all the way through epitaxial region 1002 and terminate in substrate 1000. Semi-insulating strips 1022a,b extend along the sidewalls of the trenches and electrically contact the source terminal through the top metal layer 1018 and the drain terminal through substrate region 1000. Thus, the strips form a resistive connection between drain and source terminals. During operation, the strips acquire a linear voltage gradient with the highest potential (i.e., drain potential) at their bottom to lowest potential (i.e., source potential) at their top. Strips 1022a,b are insulated from epitaxial regions 1002 by insulating layers 1026a,b. The gate structure in FIG. 10c as well as in FIGS. 10a and 10b is similar to the previous embodiments.

The semi-insulating strips in the structures of FIGS. 10a-10c serve as an additional tool by which the electrical characteristics of the device can be optimized. Depending on the application and the design targets, one structure may be preferred over the other. The resistivity of the strips of semi-insulating material in each of the FIGS. 10a, 10b, 10c structures can be adjusted and potentially varied from the top to the bottom to enable shaping of the space charge region formation in response to the applied drain-source voltage VDS.

An exemplary set of process steps for forming the structure in FIG. 10a is as follows. A hard mask is used to etch the silicon back to form wide trenches as in previous embodiments with wide trenches. A layer of thermally grown oxide having a thickness in the range of 200-1000 Å is then formed along the inner walls and bottom of the trench. About 4000 Å of conformal oxide is then deposited over the thermally grown oxide layer. Oxygen-doped polysilicon (SiPOS) is then deposited in the trench regions and etched to form strips 1008a,b along the sidewalls. The trenches are then filled with insulation using conventional methods (e.g., SOG method), followed by planarization of the oxide surface. Conventional steps used in forming self-aligned gate DMOS structures are then carried out to form the full cell structure as shown in FIG. 10a.

The depth of the trenches in the different embodiments described above may vary depending on the desired device performance and the target application for the device. For example, for high breakdown voltage (e.g., greater than 70V), the trenches may be extended deeper into the epitaxial region (e.g., to a depth of about 5 μm). As another example, the trenches can be extended all the way through the epitaxial region to meet the substrate regions (as in FIG. 10c). For lower voltage applications, the p regions (e.g., the floating p regions in FIG. 2 and the p strips in FIG. 8) need not extend deep into the epitaxial region since the device is not required to meet high breakdown voltages, and also to minimize the contribution of the p regions to the output capacitance.

Figure 11:
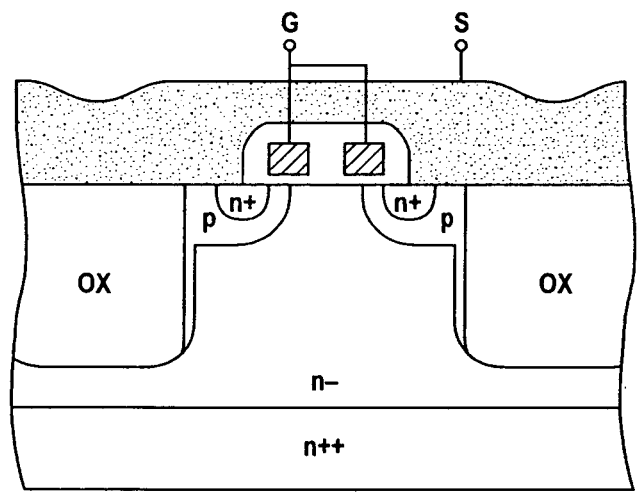
FIG. 11 shows a cross sectional view of a cell array wherein the trench structure shown in FIG. 8 is combined with a gate structure different than that shown in FIG. 8.
Figure 12:
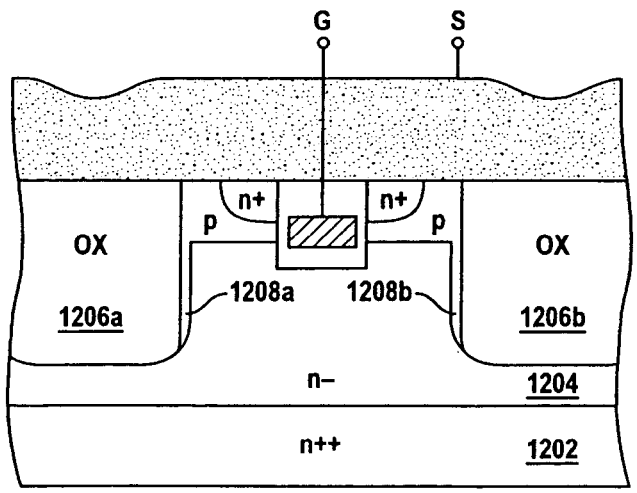
FIG. 12 shows a cross sectional view of a cell array wherein the trench structure shown in FIG. 8 is combined with yet another gate structure.

Although the trench structures in the different embodiments described above are shown in combination with the gate structure of conventional DMOS cells, the invention is not limited as such. Two examples of other gate structures with which these trench structures may be combined are shown in FIGS. 11 and 12. These two cell structures have the benefit of lower gate to drain capacitance which in combination with the low output capacitance of the trench structures yields power devices particularly suitable for high frequency applications.

The FIG. 11 structure is similar to that in FIG. 8 except that a substantial portion of the gate extending over the surface of the drift region is eliminated. Thus, the gate to drain capacitance is reduced by an amount corresponding to the eliminated portion of the gate. In the FIG. 12 structure, the trench structure in FIG. 8 is combined with the gate structure of a conventional UMOS cell. Thus, the advantages of the UMOS cell (e.g., low on-resistance) are obtained while the low output capacitance and improved thermal performance of the trench structure in accordance with the present invention are maintained. In one embodiment wherein the FIG. 12 structure is intended for lower voltage applications (e.g., in the range 30-40V) the depth of p strips 1208a,b is relatively shallow (e.g., in the range of 1.5 μm to 3 μm).

Combining the gate structures in FIGS. 11 and 12 or any other gate structure with the different trench structures described above would be obvious to one skilled in this art in view of this disclosure.

In the above embodiments, the vertical charge control enabled by the resistive elements located along the insulation-filled trenches allows the cells to be laterally spaced apart without impacting the electrical characteristics of the device. With the cells spaced further apart, the heat generated by each cell is distributed over a larger area and less heat interaction occurs between adjacent cells. A lower device temperature is thus achieved.

Although the above embodiments show the drain to be located along the bottom-side of the die, the invention is not limited as such. Each of the above cell structures can be modified to become a quasi-vertically conducting structure by including a highly-doped n-type buried layer extending along the interface between the epitaxial region and the underlying highly-doped substrate region. At convenient locations, the buried layer is extended vertically to the top surface where it can be contacted to form the drain terminal of the device. In these embodiments, the substrate region may be n-type or p-type depending on the application of the MOSFET.

As mentioned earlier, edge termination structures with breakdown voltages equal to or greater than that of the individual cells are required to achieve a high device breakdown voltage. In the case of the FIG. 8 structure, simulation results indicate that terminating at the outer edge of the device with a trench structure like trench 804b would result in higher electric fields due to the electric field transition up to the top surface at the outside of the outer trench. An edge termination structure which yields the same or higher breakdown voltage than the cell structure in FIG. 8 is shown in FIG. 13.

Figure 13:
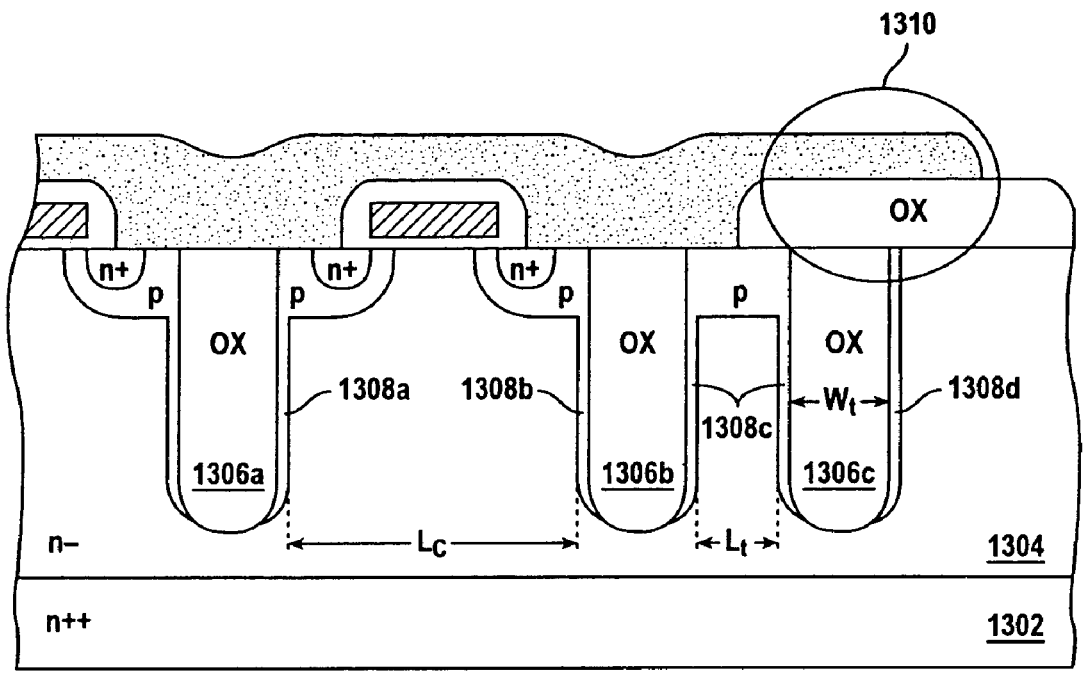
FIG. 13 shows a cross-sectional view of an edge termination structure in accordance with one embodiment of the present invention.

In FIG. 13, the active gate over the drift region between the outer two trenches 1306b and 1306c is eliminated allowing the drift region spacing Lt between these outer two trenches to be reduced to less than the drift region spacing Lc in the cell structures. The active gate however may be left in if obtaining the Lt spacing does not require its removal. The outer p strip 1308d is not biased (i.e., is floating), and may be eliminated if desired. A conventional field plate structure 1310 is optionally included in FIG. 13. The termination structure in FIG. 13 results in: (a) the depletion region terminating within the outer trench 1306c, thus reducing the electric filed at the outside of trench 1306c, and (b) the field on the inside of outer trench 1306c is reduced due to short Lt spacing pushing the depletion region into the drift region.

In another embodiment, the gate structure is included between trenches 1306b and 1306c, with spacing Lt equaling spacing Lc. In this embodiment, the p strip immediately to the right of the gate structure between trenches 1306b and 1306c (i.e., the p strip corresponding to the strip along the left side of trench 1306c) is not connected to the source and thus floats.

Other variations of the FIG. 13 embodiment are possible. For example, floating guard-rings may be used on the outside of trench 1306c with or without field plate structure 1310. Although cell trenches 1306a,b and termination trench 1306c are shown to be narrower than the cell trenches in FIG. 8, trenches 1306a,b,c may be widened as in FIG. 8. Further, the width Wt of termination trench 1306c may be designed to be different than cell that of trenches 1306a,b if desired.

Figure 14:
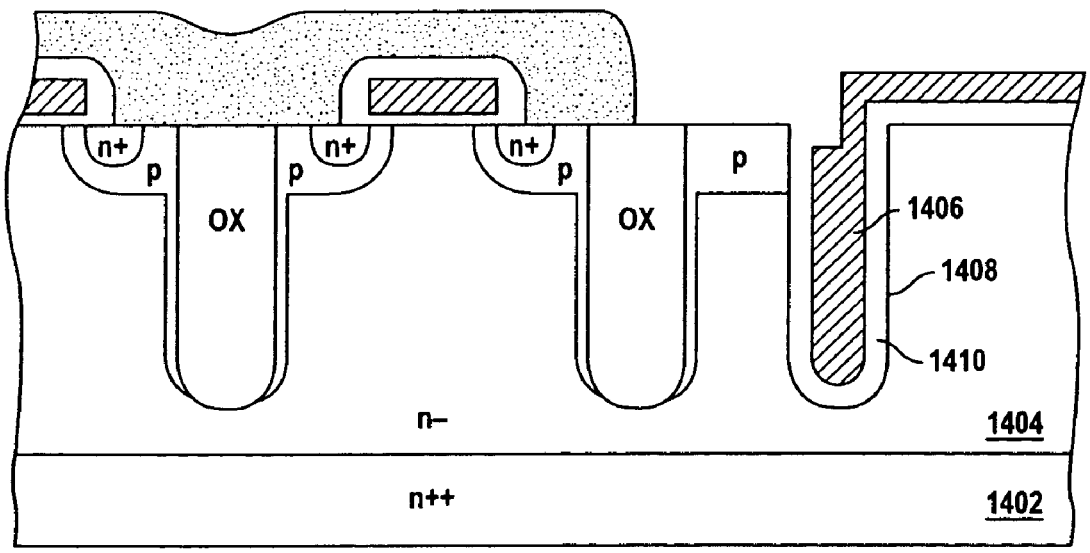
FIG. 14 shows a cross-sectional view of another edge termination structure in accordance with another embodiment of the present invention.

FIG. 14 is a cross sectional view showing another termination structure in combination with the cell structure shown in FIG. 8. As shown, the termination structure includes a termination trench 1408 lined with an insulation layer 1410 along its sidewalls and bottom. A field plate 1406 (e.g., from doped polysilicon) is provided over insulation layer 1410 in trench 1408, and extends laterally over the surface and away from the active regions.

Although the above-described termination structures are shown in combination with the cell structure in FIG. 8, these and other known termination structures may be combined with any of the cell structures described above.

While the above is a complete description of the embodiments of the present invention, it is possible to use various alternatives, modifications and equivalents. For example, the different embodiments described above are n-channel power MOSFETs. Designing equivalent p-channel MOSFETs would be obvious to one skilled in the art in light of the above teachings. Further, p+ regions, similar to p+ regions 210a,b in the FIG. 2 structure, may be added in the body regions of the other structures described herein to reduce the body resistance and prevent punch-through to the source. Also, the cross sectional views are intended for depiction of the various regions in the different structures and do not necessarily limit the layout or other structural aspects of the cell array. Therefore, the scope of the present invention should be determined not with reference to the above description but should, instead, be determined with reference to the appended claim, along with their full scope of equivalents.

What is claimed is:

1. A field effect transistor comprising:
a first semiconductor region having a first surface; and
first and second insulation-filled trench regions each extending from the first surface into the first semiconductor region, each of the first and second insulation-filled trench regions having an outer layer of silicon of a conductivity type opposite that of the first semiconductor region, the outer layer of silicon being lightly doped silicon so that a depletion region formed in the first semiconductor region during an operation mode of the field effect transistor is extended into the first semiconductor region away from the first surface,
wherein the first and second insulation-filled trench regions are spaced apart in the first semiconductor region to form a drift region therebetween, the volume of each of the first and second trench regions being greater than one-quarter of the volume of the drift region.

2. A field effect transistor comprising:
a first semiconductor region having a first surface;
first and second insulation-filled trench regions each extending from the first surface into the first semiconductor region, each of the first and second insulation-filled trench regions having an outer layer of silicon of a conductivity type opposite that of the first semiconductor region;
a body region extending from the first surface into the first semiconductor region, the body region being of a conductivity type opposite that of the first semiconductor region;
a source region in the body region, the source region being of the same conductivity type as the first semiconductor region;
a gate trench region extending from the first surface into the first semiconductor region; and
a gate recessed in the gate trench region extending across a portion of the body region and overlapping the source and the first semiconductor regions such that a channel region extending perpendicularly to the first surface is formed in the body region between the source and first semiconductor regions,
wherein the first and second insulation-filled trench regions are spaced apart in the first semiconductor region to form a drift region therebetween, the volume of each of the first and second trench regions being greater than one-quarter of the volume of the drift region so as to reduce output capacitance and improve thermal performance of the field effect transistor.

3. A field effect transistor comprising:
a first semiconductor region having a first surface;
first and second insulation-filled trench regions each extending from the first surface into the first semiconductor region, each of the first and second insulation-filled trench regions having an outer layer of silicon of a conductivity type opposite that of the first semiconductor region;
first and second body regions each extending from the first surface into the first semiconductor region, the first body region being laterally spaced from the second body region to form a JFET region therebetween, the first and second body regions being of a conductivity type opposite that of the first semiconductor region; and
first and second source regions in the first and second body regions respectively, the first and second source regions being of the same conductivity type as the first semiconductor region,
wherein the first and second insulation-filled trench regions are spaced apart in the first semiconductor region to form a drift region therebetween, the volume of each of the first and second trench regions being greater than one-quarter of the volume of the drift region.

4. The field effect transistor of claim 3 further comprising a gate extending over but being insulated from the JFET region and a portion of the first and second body regions, and overlapping the first and second source regions such that a channel region is formed along a body surface of each of the first and second body regions between the corresponding source and JFET regions.

5. The field effect transistor of claim 3 further comprising:
a gate extending over but being insulated from each of the first and second body regions such that a channel region is formed along a surface of each of the first and second body regions between the corresponding source and JFET regions, the gate being discontinuous over a surface of the JFET region between the first and second body regions.

6. A field effect transistor comprising:
a first semiconductor region over a substrate, the first semiconductor region having a first surface; and
first and second insulation-filled trench regions each extending from the first surface to a predetermined depth within the first semiconductor region, each of the first and second insulation-filled trench regions having an outer layer of doped silicon material which is discontinuous along a bottom surface of the insulation-filled trench region so that the insulation material along the bottom surface of the insulation-filled trench region is in direct contact with the first semiconductor region, the outer layer of silicon material being of a conductivity type opposite that of the first semiconductor region,
wherein the outer layer of doped silicon of each of the first and second insulation-filled trench regions is lightly doped so that a depletion region formed in the first semiconductor region during an operation mode of the field effect transistor is further extended into the first semiconductor region away from the first surface.

7. A field effect transistor comprising:
a first semiconductor region over a substrate, the first semiconductor region having a first surface;
first and second insulation-filled trench regions each extending from the first surface to a predetermined depth within the first semiconductor region, each of the first and second insulation-filled trench regions having an outer layer of doped silicon material which is discontinuous along a bottom surface of the insulation-filled trench region so that the insulation material along the bottom surface of the insulation-filled trench region is in direct contact with the first semiconductor region, the outer layer of silicon material being of a conductivity type opposite that of the first semiconductor region;
a body region extending from the first surface into the first semiconductor region, the body region being of a conductivity type opposite that of the first semiconductor region;
a source region in the body region, the source region being of the same conductivity type as the first semiconductor region;
a gate trench region extending from the first surface into the first semiconductor region; and
a gate in the gate trench region extending across a portion of the body region and overlapping the source and the first semiconductor regions such that a channel region extending perpendicularly to the first surface is formed in the body region between the source and first semiconductor regions.

8. A field effect transistor comprising:
a first semiconductor region over a substrate, the first semiconductor region having a first surface;
first and second insulation-filled trench regions each extending from the first surface to a predetermined depth within the first semiconductor region, each of the first and second insulation-filled trench regions having an outer layer of doped silicon material which is discontinuous along a bottom surface of the insulation-filled trench region so that the insulation material along the bottom surface of the insulation-filled trench region is in direct contact with the first semiconductor region, the outer layer of silicon material being of a conductivity type opposite that of the first semiconductor region;
first and second body regions each extending from the first surface into the first semiconductor region, the first body region being laterally spaced from the second body region to form a JFET region therebetween, the first and second and body regions being of a conductivity type opposite that of the first semiconductor region; and
first and second source regions in the first and second body regions respectively, the first and second source regions being of the same conductivity type as the first semiconductor region.

9. The field effect transistor of claim 8 further comprising a gate extending over but being insulated from the JFET region and a portion of the first and second body regions, and overlapping the first and second source regions such that a channel region is formed along a body surface of each of the first and second body regions between the corresponding source and JFET regions.

10. The field effect transistor of claim 8 further comprising:
a gate extending over but being insulated from each of the first and second body regions such that a channel region is formed along a surface of each of the first and second body regions between the corresponding source and JFET regions, the gate being discontinuous over a surface of the JFET region between the first and second body regions.

11. A field effect transistor comprising:
a first semiconductor region over a substrate, the first semiconductor region having a first surface;
first and second insulation-filled trench regions each extending from the first surface to a predetermined depth within the first semiconductor region, each of the first and second insulation-filled trench regions having an outer layer of doped silicon material which is discontinuous along a bottom surface of the insulation-filled trench region so that the insulation material along the bottom surface of the insulation-filled trench region is in direct contact with the first semiconductor region, the outer layer of silicon material being of a conductivity type opposite that of the first semiconductor region; and
a termination structure comprising a termination trench region extending from the first surface into the first semiconductor region, the termination trench being filled with a semi-insulating material, the semi-insulating material being insulated from the first semiconductor region.

12. The field effect transistor of claim 11 wherein the termination trench region is laterally spaced from the first and second trench regions so that during an operating mode of the field effect transistor a substantially uniform electric field in the region between the termination trench region and the first and second trench regions is obtained.

13. The field effect transistor of claim 11 wherein the semi-insulating material extends over the first surface in a direction away from the first and second trench regions such that during an operating mode of the field effect transistor the electric field in the first semiconductor region under the portion of the semi-insulating material extending over the first surface is substantially reduced.

14. A field effect transistor comprising:
a first semiconductor region over a substrate, the first semiconductor region having a first surface;
first and second insulation-filled trench regions each extending from the first surface to a predetermined depth within the first semiconductor region, each of the first and second insulation-filled trench regions having an outer layer of doped silicon material which is discontinuous along a bottom surface of the insulation-filled trench region so that the insulation material along the bottom surface of the insulation-filled trench region is in direct contact with the first semiconductor region, the outer layer of silicon material being of a conductivity type opposite that of the first semiconductor region; and a termination structure comprising an insulation-filled termination trench region extending from the first surface into the first semiconductor region, the termination trench region being laterally spaced from the first and second trench regions so that during an operating mode of the field effect transistor a substantially uniform electric field in the region between the termination trench region and the first and second trench regions is obtained.

15. The field effect transistor of claim 14 wherein the insulation-filled termination trench region includes an outer layer of doped silicon material which is discontinuous along a bottom surface of the insulation-filled trench region so that the insulation material along the bottom surface of the insulation-filled trench region is in direct contact with the first semiconductor region.

16. The field effect transistor of claim 2 wherein the gate trench region further includes:

a gate dielectric lining sidewalls of the gate trench region; and a thick bottom dielectric filling a bottom portion of the gate trench region below the gate.

17. The field effect transistor of claim 6 wherein the first and second insulation-filled trench regions are spaced apart in the first semiconductor region to form a drift region therebetween, the volume of each of the first and second insulation-filled trench regions being greater than one-quaffer of the volume of the drift region so as to reduce output capacitance and improve thermal performance of the field effect transistor.

* * * * *